United States Patent
Koyama et al.

(10) Patent No.: US 7,612,413 B2
(45) Date of Patent: Nov. 3, 2009

(54) SEMICONDUCTOR DEVICE AND MANUFACTURING METHOD THEREOF

(75) Inventors: Masato Koyama, Miura-gun (JP); Reika Ichihara, Yokohama (JP); Yoshinori Tsuchiya, Yokohama (JP); Yuuichi Kamimuta, Yokohama (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 11/461,646

(22) Filed: Aug. 1, 2006

(65) Prior Publication Data

US 2007/0145488 A1 Jun. 28, 2007

(30) Foreign Application Priority Data

Nov. 24, 2005 (JP) ............................. 2005-338789

(51) Int. Cl.
*H01L 27/092* (2006.01)
(52) U.S. Cl. ............................. 257/369; 257/E21.635
(58) Field of Classification Search ................. 257/369, 257/E21.635, E21.637
See application file for complete search history.

(56) References Cited

U.S. PATENT DOCUMENTS

| 6,864,163 | B1 * | 3/2005 | Yu et al. ..................... 438/585 |
| 2005/0189597 | A1 * | 9/2005 | Masuoka et al. ............. 257/371 |
| 2006/0051880 | A1 * | 3/2006 | Doczy et al. .................. 438/3 |
| 2006/0071275 | A1 * | 4/2006 | Brask et al. .................. 257/350 |
| 2006/0261436 | A1 * | 11/2006 | Turner et al. ................. 257/506 |
| 2007/0145488 | A1 | 6/2007 | Koyama et al. |

FOREIGN PATENT DOCUMENTS

| JP | 2007-165414 | 6/2007 |
| JP | 2007-173412 | 7/2007 |

OTHER PUBLICATIONS

U.S. Appl. No. 11/235,246, filed Sep. 27, 2005, Masato Koyama, et al.
Dae-Gyu Park, et al."Robust Ternary Metal Gate Electrodes for Dual Gate CMOS Devices", IEDM, 2001, pp. 671-674.
J.K. Schaeffer, et al., "Challenges for the Integration of Metal Gate Electrodes", IEDM, 2004, pp. 287-290.
Reika Ichihara, et al., "Ta-based metal gates (Ta, $TaB_x$, $TaN_x$ and $TaC_x$)-Modulated Work Function and Improved Thermal Stability-", Extended Abstracts of the 2005 International Conference on Solid State Devices and Materials, Sep. 13-15, 2005, pp. 850-851 and cover page.
U.S. Appl. No 12/133,583, filed Jun. 5, 2008, Koyama, et al.
U.S. Appl. No. 12/388,965, filed Feb. 19, 2009, Tatsumura, et al.

* cited by examiner

*Primary Examiner*—Lynne A. Gurley
*Assistant Examiner*—Colleen A Matthews
(74) *Attorney, Agent, or Firm*—Oblon, Spivak, McClelland, Maier & Neustadt, L.L.P.

(57) ABSTRACT

A semiconductor device includes a substrate, a p-channel MIS transistor formed on the substrate, the p-channel MIS transistor having a first gate electrode, and an n-channel MIS transistor formed on the substrate separately from the p-channel MIS transistor, the n-channel MIS transistor having a second gate electrode. Each of the first gate electrode and the second gate electrode is formed of an alloy of Ta and C in which a mole ratio of C to Ta (C/Ta) is from 2 to 4.

15 Claims, 10 Drawing Sheets

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-338789, filed Nov. 24, 2005, the entire contents of which are incorporated herein by reference.

BACKGROUND OF THE INVENTION

1. Field of the Invention

The present invention relates to a semiconductor device having, on the same substrate, a p-channel MIS transistor and an n-channel MIS transistor in which the gate electrode structure is improved, and to a manufacturing method thereof.

2. Description of the Related Art

Recently, in silicon complementary metal oxide semiconductor (CMOS) devices, an attempt has been made to use, as a gate electrode, a high-melting-point metal such as titanium, molybdenum, tungsten or tantalum, or a nitride thereof. This is called the metal gate technique.

In the metal gate technique, depletion layers are not generated within the gate electrode in principle, and there is therefore no decrease in current drivability of a metal insulator semiconductor (MIS) transistor due to the depletion layers, in contrast with the case of a silicon gate. Particularly, in the so-called single metal gate technique in which a single metal gate material constitutes both gate electrodes of an n-channel MIS transistor and a p-channel MIS transistor, common deposition and processing of the gate electrodes of the n-channel MIS transistor and the p-channel MIS transistor are realized. This makes it possible to solve problems such as complication of a process and an increase in the number of steps which arise when different metal gates are used in the n-channel MIS transistor and the p-channel MIS transistor.

Materials such as TIN and TaN have heretofore been proposed as single metal gate materials. These materials have a work function ranging from 4.5 to 4.7 eV, and therefore permit threshold voltages of the n-channel MIS transistor and the p-channel MIS transistor to be set at the similar values with a single metal gate.

However, the single metal gate materials of this kind have a characteristic of taking on a polycrystalline structure regardless of composition and a film formation method. This has a considerable disadvantage on device characteristics. That is, the work functions of these materials are much dependent on crystal face orientation and fluctuate on a scale corresponding to crystal grain size in a polycrystalline thin film. Typical crystal grain sizes are about several tens to several hundreds of nm, and these dimensions are at about the same values as the gate lengths of future transistors. Therefore, when polycrystalline gate electrodes are used, the work functions of the gate electrodes fluctuate between transistors, and the threshold voltages also fluctuate. Since uniform performance is required in the transistors, this characteristic fluctuation is not allowable.

In order to solve this problem, it is necessary to use a monocrystalline metal gate or to adopt structural characteristics only having a fluctuation much smaller than the characteristic sizes (gate lengths) of the devices. Concerning the latter structure, an amorphous TaSiN metal gate electrode has been proposed (e.g., refer to D. G. Park et al., "Robust Ternary Metal Gate Electrodes for Dual Gate CMOS Devices", 2001 IEDM, pp. 671 to 674). Amorphous substances have very high structural homogeneity and do not cause obvious characteristic fluctuation. However, the work function of the TaSiN metal gate is about 4.4 eV, and it has thus been impossible to use the TaSiN metal gate as the single metal gate.

Furthermore, a TaCx metal gate technique has been proposed in which a TaCx electrode is used for an n-channel MIS transistor (e.g., refer to J. K. Schaeffer et al., "Challenges for the Integration of Metal Gate Electrodes", 2004 IEDM, p.p. 287 to 290). However, in this technique, the work function of the TaCx electrode is 4.18 eV, so that even if the TaCx electrode is used for the gate electrode of a p-channel MIS transistor, its threshold voltage becomes very high, and normal operation of the CMOS is impossible.

As has been described, it has been essential to replace the conventional silicon gate and introduce the metal gate technique in order to improve the current drivability of the transistor and realize a silicon CMOS device with a high processing speed. However, under the present circumstances, it is not possible to realize a single metal gate structure suitable to prevent the device characteristic fluctuation.

Thus, it is desired to realize a semiconductor device and a manufacturing method thereof which can realize the single metal gate structure suitable for use in, for example, silicon CMOS devices and which enable a decrease in the device characteristic fluctuation and attain higher reliability.

BRIEF SUMMARY OF THE INVENTION

According to a first aspect of the invention, there is provided a semiconductor device, which includes:
a substrate;
a p-channel MIS transistor formed on the substrate, the p-channel MIS transistor having a first gate electrode; and
an n-channel MIS transistor formed on the substrate separately from the p-channel MIS transistor, the n-channel MIS transistor having a second gate electrode,
each of the first gate electrode and the second gate electrode being formed of an alloy of Ta and C in which a mole ratio of C to Ta (C/Ta) is from 2 to 4.

According to a second aspect of the invention, there is provided a semiconductor device, which includes:
a substrate;
an n-type semiconductor region formed on the substrate;
a p-type semiconductor region formed on the substrate so as to be insulated and separated from the n-type semiconductor region;
a p-channel MIS transistor formed on the n-type semiconductor region, the p-channel MIS transistor including:
a first gate dielectric film formed on the n-type semiconductor region,
a first lower gate electrode made of an alloy of Ta and C and formed on the gate dielectric film, and
a first upper gate electrode including silicon and formed on the first lower gate electrode; and
an n-channel MIS transistor formed on the p-type semiconductor region, the n-channel MIS transistor including:
a second gate dielectric film formed on the p-type semiconductor region,
a second lower gate electrode made of an alloy of Ta and C and formed on the gate dielectric film, and
a second upper gate electrode including silicon and formed on the second lower gate electrode, and
a mole ratio of C to Ta (C/Ta) in the first lower gate electrode and the second lower gate electrode being from 2 to 4.

According to a third aspect of the invention, there is provide a manufacturing method of a semiconductor device, which includes:

forming an n-type semiconductor region and a p-type semiconductor region on a semiconductor substrate in an isolated and separated manner;

forming a gate dielectric film on each of the n-type semiconductor region and the p-type semiconductor region; and forming, on the gate dielectric film, a gate electrode which is made of an alloy of Ta and C and in which a mole ratio of C to Ta (C/Ta) is from 2 to 4, in each of the n-type semiconductor region and the p-type semiconductor region.

DETAILED DESCRIPTION OF THE INVENTION

Figure 1:
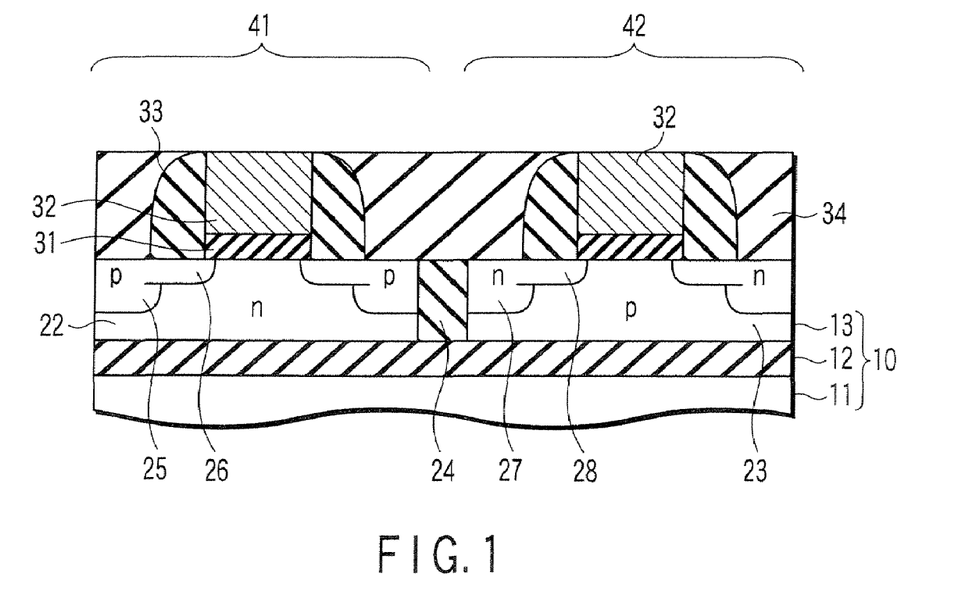
FIG. 1 is an element structure sectional view showing a schematic structure of a semiconductor device according to a first embodiment.

Before describing embodiments, the outline and principle of the embodiments of the present invention will first be described. A semiconductor device of the present embodiments comprises a CMOS device as shown in FIG. 1, and has TaCx as gate electrodes of both a p- and an n-channel MIS transistors.

It is to be noted that, in the drawing, 10 denotes an SOI substrate; 11, an Si substrate; 12, a buried dielectric film; 13, an Si layer; 22, an n-type well; 23, a p-type well; 24, an isolation dielectric film; 25, a p-type diffusion layer; 26, a p-type extension layer; 27, an n-type diffusion layer; 28, an n-type extension layer; 31, a gate dielectric film; 32, a TaCx gate electrode; 33, a gate sidewall dielectric film; 34, an interlayer dielectric film; 41, a p-channel MIS transistor, and 42, an n-channel MIS transistor.

On the other hand, a TaCx metal gate technique is described in the above-mentioned thesis of J. K. Schaeffer et al. The difference between this reference technique and the present embodiment is that while TaCx is used for both the p- and n-channel MIS transistors in the present embodiment, a TaCx electrode is only used in the n-channel MIS transistor in the reference technique. The reference technique has such a limitation because the work function of the TaCx electrode is 4.18 eV. Even if TaCx of the reference technique is used in the gate electrode of the p-channel MIS transistor, its threshold voltage becomes very high, and a normal operation of the CMOS is impossible.

Figure 2:
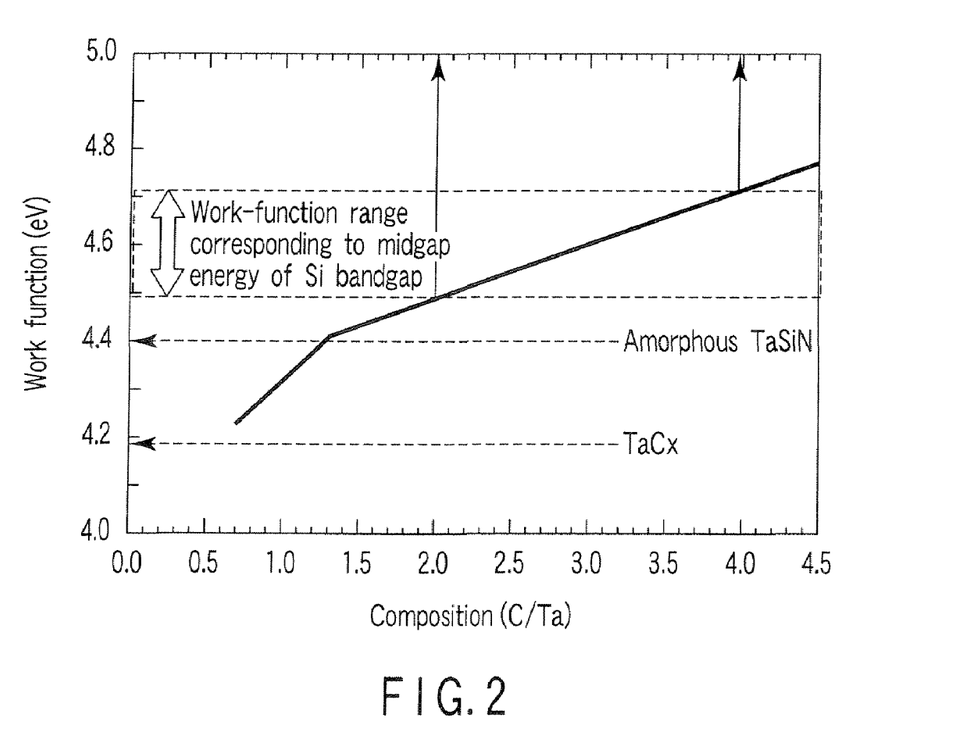
FIG. 2 is a characteristic chart showing a relation between a TaCx electrode composition and a work function.

In contrast, the present embodiment is characterized in that a mole ratio of C to Ta (C/Ta) is optimally set to bring the work function of the TaCx metal gate to a value suitable for the gates of the p- and n-channel MIS transistors. FIG. 2 shows the results of an experiment by the present inventors indicating a relation between the composition of the TaCx electrode and the work function. The present inventors have conducted the experiment in which the composition is systematically changed and have found out that the work function of the TaCx metal gate can be brought into a range of 4.5 to 4.7 eV by setting the mole ratio of C to Ta (C/Ta) at 2 to 4. In this manner, even if TaCx is used in both the p- and n-channel MIS transistors, the threshold voltages of the transistors can be set at low values.

Figure 3:
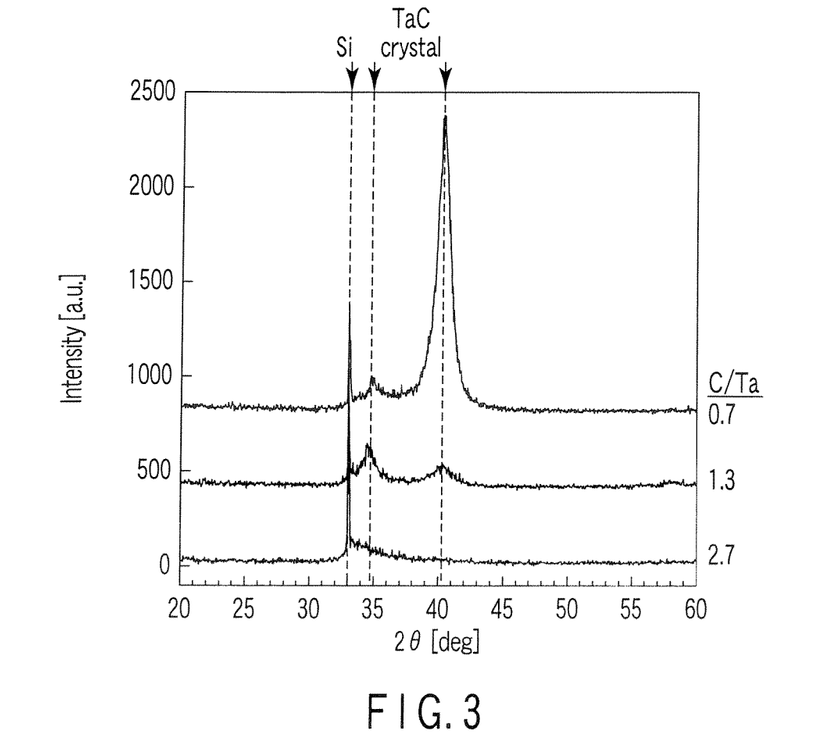
FIG. 3 is a diagram showing x-ray diffractometry (XRD) spectra to explain a relation between the TaCx electrode composition and a change in crystallinity.

Furthermore, in the present embodiment, the TaCx gate electrode is amorphous or is phase-separated with a size of 5 nm or less. The present inventors have found, from the experiment in which the composition is systematically changed, that such structural characteristics are realized when (C/Ta) is 1.5 or more. FIG. 3 concerns XRD spectra showing part of the results in which the crystallinity of a TaCx film is examined.

When (C/Ta)≅0.7, very strong TaC crystal peak was observed. Conversely, when (C/Ta)≅1.3, the TaC crystal peak was weaker, and when (C/Ta)≅2.7, no peak was observed from the TaCx film. In an experiment in which the composition was more finely changed, it was found that the critical value of the composition at which the crystal peak was no longer observed was (C/Ta)=1.5.

Figure 4:
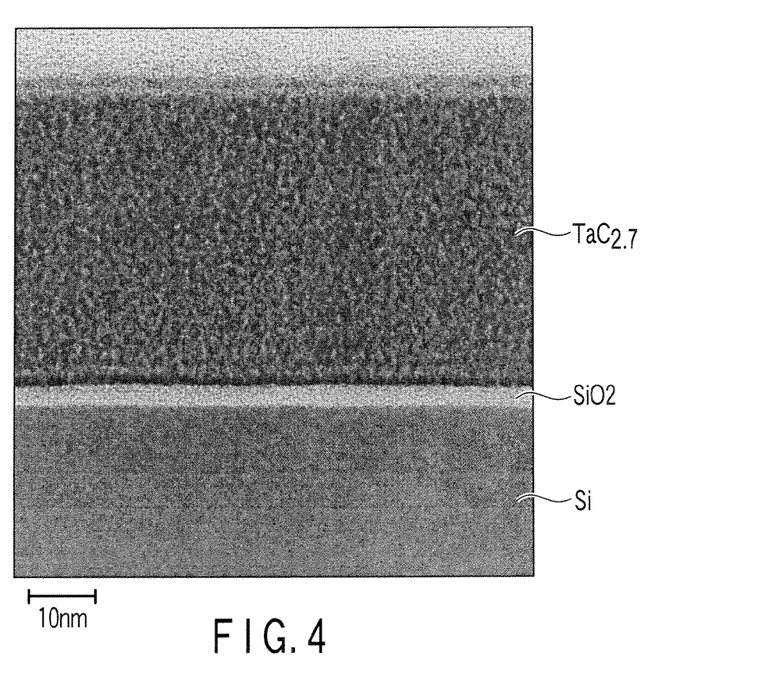
FIG. 4 is a photomicrograph showing a cross-sectional transmission electron microscopy (TEM) image of the TaCx electrode.

FIG. 4 shows a cross-sectional TEM image of the TaCx film when (C/Ta)≅2.7. The TaCx film shows black and white contrast. Ta accumulates in black places, and white places are rich in carbon. The sizes of the places where Ta accumulates are 1 nm or lower in this composition.

Figure 5:
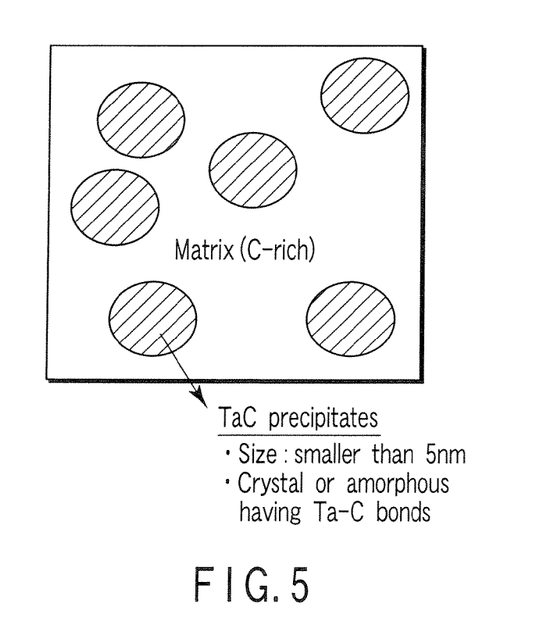
FIG. 5 is a schematic diagram to explain the characteristics of a TaCx electrode having a phase-separated structure with a nanometer size.

FIG. 5 is a schematic diagram showing the characteristics of the TaCx gate electrode in the present embodiment. TaC precipitates having a diameter of 5 nm or less are formed in a C-rich TaCx (2<x) matrix. The TaC precipitates may be crystallized or in an amorphous state. The TaCx (2<x) matrix is in an amorphous state. The TaC precipitates are shown in black in the above-mentioned experiment results in FIG. 4.

Figure 6:
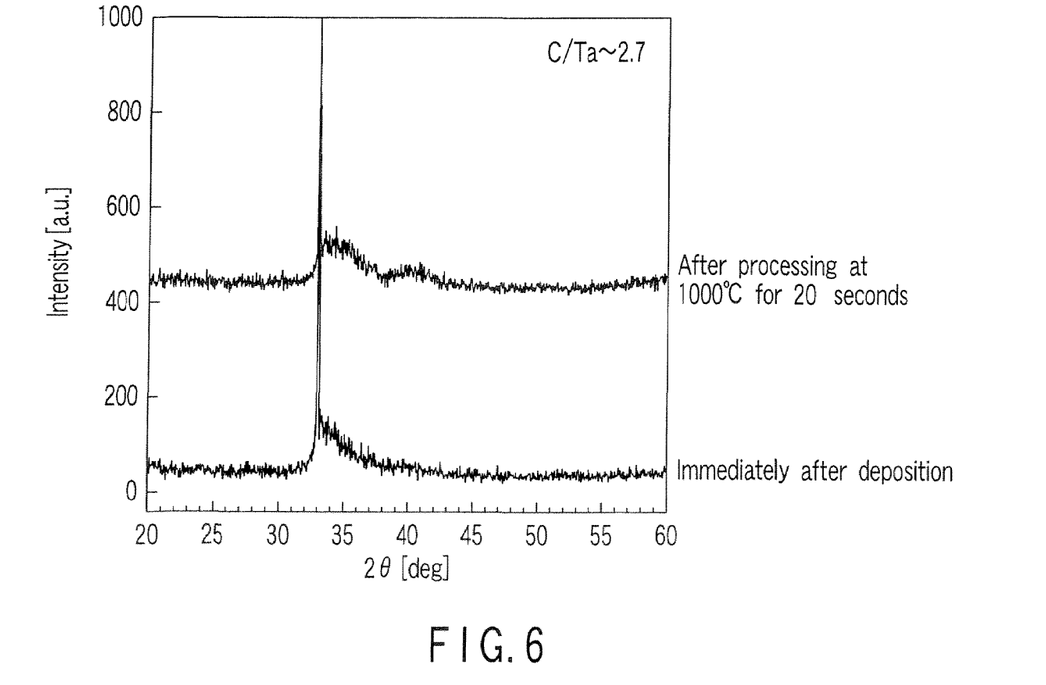
FIG. 6 is a diagram showing XRD spectra to explain experimental results of examining a structural change due to a high-temperature heat treatment of the TaCx electrode.

It has been proved that the TaCx gate electrode within the range of the composition of the present embodiment has little change in its structure even after a conventional LSI manufacturing process. FIG. 6 shows XRD spectra before and after a TaCx thin film of (C/Ta)≅2.7 is subjected to a heat treatment at 1000° C. for 20 seconds. A heat treatment at 1000° C. for 20 seconds is an ordinary condition in the conventional LSI manufacture, and even after this heat treatment, almost no change was observed in the XRD spectra. A small amount of diffraction line can be seen at a position where the TaC crystal peak emerges in the vicinity of 2θ≅40°, but its full width at half maximum is extremely large, and it can be judged from the perspective of an X-ray analysis that this is an amorphous structure or a phase-separated structure having a crystal size of 1 nm or less.

Figure 7:
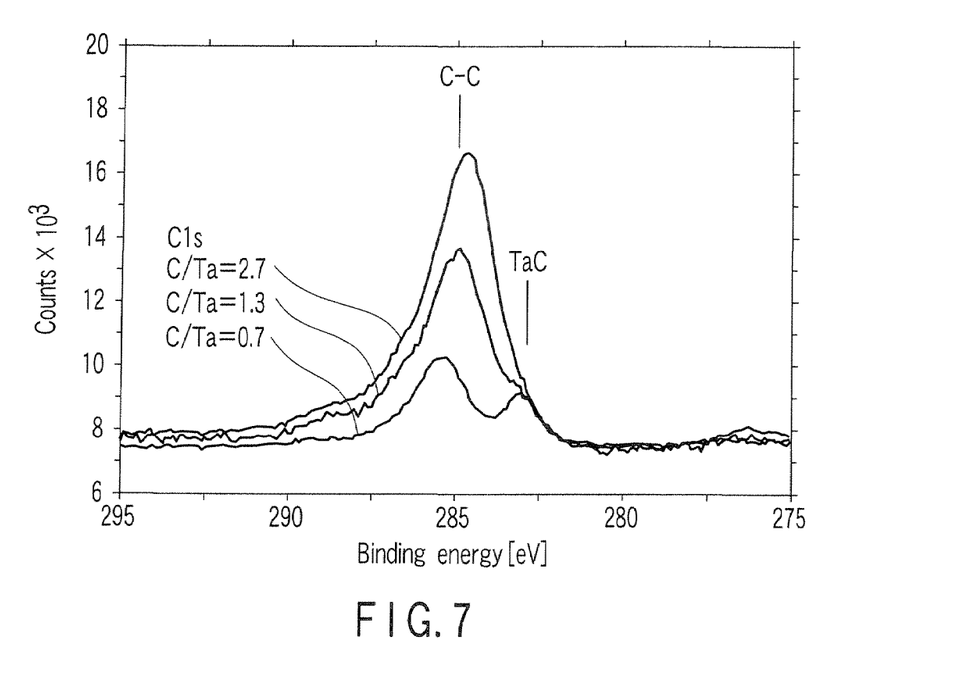
FIG. 7 is a diagram showing X-ray photoelectron spectroscopy (XPS) spectra analyzing the microscopic atomic structure of the TaCx electrode having the phase-separated structure with a nanometer size.

FIG. 7 shows C1s spectra in accordance with the XPS in which the microscopic atomic bonding state of the TaC gate electrode of the present invention which is phase-separated with a nanometer size is examined. It is apparent that carbon or Ta exists at the nearest neighbor site seen from carbon within the TaC film regardless of the composition thereof. It has been proved that in the composition range of the present embodiment (C/Ta=2 to 4), carbon mostly constitutes the nearest neighbor site of carbon and a small amount of Ta—C bonds exists therein (C/Ta=2.7 in FIG. 7). C—C bonds mainly originated from C—C bonds existing in the matrix of the TaC electrode, and C—Ta bonds mainly originated from the TaC precipitates.

Thus, as a result of the detailed examination of the physical characteristics of the TaCx thin film, it has been newly found out that the mole ratio of C to Ta (C/Ta) can be controlled to control both the work function and the structural characteristics, and that such characteristics are stable even under a heat treatment at 1000° C. The present embodiment has been carried out on the basis of this new discovery, and has a structure and effects completely different from those in the category of conventional techniques.

It is to be noted that there has heretofore been, as an amorphous gate electrode, a TaSiN gate electrode shown in the above-mentioned thesis of D. G. Park et al. If this technique is used, the fluctuation of the threshold voltage does not become obvious even in a future transistor having a gate length of 10 nm. However, the work function of TaSiN is about 4.4 eV, which is suitable to design the threshold voltage of the n-channel MIS transistor, but the threshold voltage of the p-channel MIS transistor becomes too high, such that a CMOS transistor can not normally operate.

Figure 8:
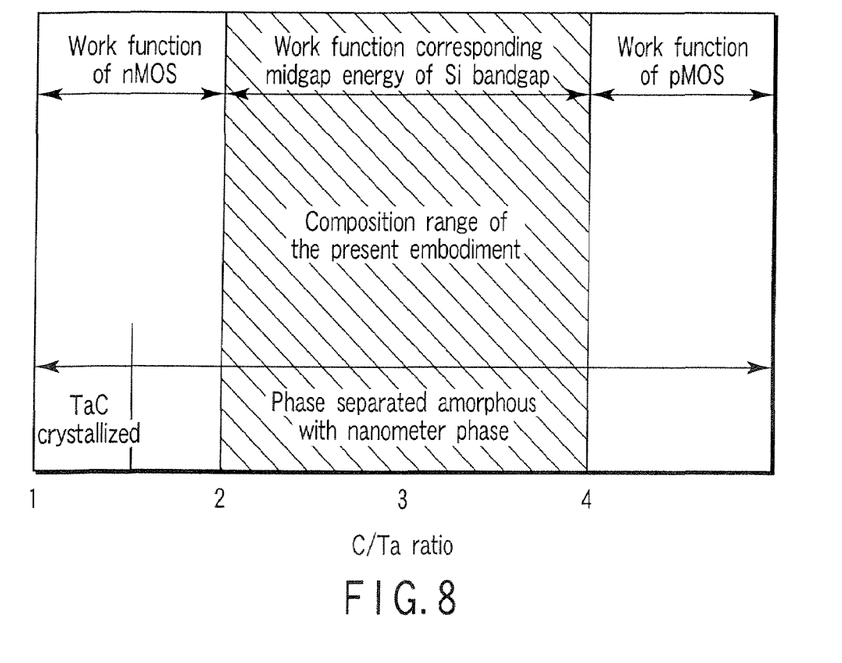
FIG. 8 is a schematic diagram showing grounds for the stipulation of a mole ratio of C to Ta (C/Ta)

The mole ratio of C to Ta (C/Ta) in the TaCx electrode of the present embodiment is limited to a range from 2 to 4, as shown in FIG. 8. The range of (C/Ta) to bring the work function of TaCx to 4.5 to 4.7 eV suitable for a single metal gate is from 2 to 4. On the other hand, for TaCx to have an amorphous structure or a phase-separated structure of 5 nm or less in which no variation is shown in the threshold voltage, (C/Ta) needs to be 1.5 or more. It is required that the TaCx gate electrode of the present embodiment have a work function of 4.5 to 4.7 eV and have an amorphous structure or a phase-separated structure with a characteristic size of 5 nm or less. The composition range satisfying these requirements is from 2 to 4 in (C/Ta).

The structure whose outline has been described above makes it possible to provide, through an easy process, a semiconductor device comprising a high-performance metal gate CMOS device having a very small characteristic variation and having no gate depletion.

According to the embodiments described from now on, the gate electrode is formed of an alloy of Ta and C, and the ratio of C to Ta (C/Ta) is set to 2 to 4, such that it is possible to obtain a work function optimal for a single gate metal, and a decrease in characteristic fluctuation and high reliability can be achieved in, for example, the CMOS device. Details of the present invention will hereinafter be described through the embodiments.

First Embodiment

As shown in FIG. 1, in a semiconductor device according to a first embodiment, an Si layer 13 is formed on an Si substrate 11 via a buried dielectric film 12 to configure an SOI substrate 10, and an n-type well region 22 and a p-type well region 23 are provided in the Si layer 13 of the SOI substrate 10. The n-type well region 22 is separated from the p-type well region 23 by an isolation dielectric film 24. It is to be noted that the SOI substrate is used as the substrate in the present embodiment, but a bulk substrate may naturally be used.

The n-type well region 22 is provided with a p-channel MIS transistor 41. The p-channel MIS transistor 41 comprises a p-type diffusion layer 25, a p-type extension layer 26, a gate dielectric film 31 and a TaCx gate electrode 32. The gate dielectric film 31 is provided on the n-type well region 22, and the TaCx gate electrode 32 is provided on the gate dielectric film 31. It is to be noted that in the present embodiment, sidewall dielectric films 33 made of an insulating material are provided on both sides of a laminated structure of the gate dielectric film 31 and the TaCx gate electrode 32.

Furthermore, the p-type extension layer 26 is provided in the n-type well regions 22 on both sides of the laminated structure of the gate dielectric film 31 and the TaCx gate electrode 32, and the p-type diffusion layers 25 are provided in the n-type well regions 22 on both sides of the sidewall dielectric film 33. The p-type diffusion layer 25 is configured so that it is bonded to the n-type well region 22 more deeply than the p-type extension layer 26. Moreover, the p-type diffusion layer 25 and the p-type extension layer 26 serve as source/drain regions of the p-channel MIS transistor 41.

On the other hand, the p-type well region 23 is provided with an n-channel MIS transistor 42. The n-channel MIS transistor 42 comprises an n-type diffusion layer 27, an n-type extension layer 28, a gate dielectric film 31 and a TaCx gate electrode 32. The gate dielectric film 31 is provided on the p-type well region 23, and the TaCx gate electrode 32 is provided on the gate dielectric film 31. It is to be noted that in the present embodiment, sidewalls 33 made of the insulating material are provided on both sides of a laminated structure of the gate dielectric film 31 and the TaCx gate electrode 32.

Furthermore, the n-type extension layer 28 is provided in the p-type well region 23 on both sides of the laminated structure of the gate dielectric film 31 and the TaCx gate electrode 32, and the n-type diffusion layer 27 is provided in the p-type well regions 23 on both sides of the sidewall dielectric film 33. The n-type diffusion layer 27 is configured so that it is bonded to the p-type well region 23 more deeply than the n-type extension layer 28. Moreover, the n-type diffusion layer 27 and the n-type extension layer 28 serve as source/drain regions of the n-channel MIS transistor 42.

Figure 9A:
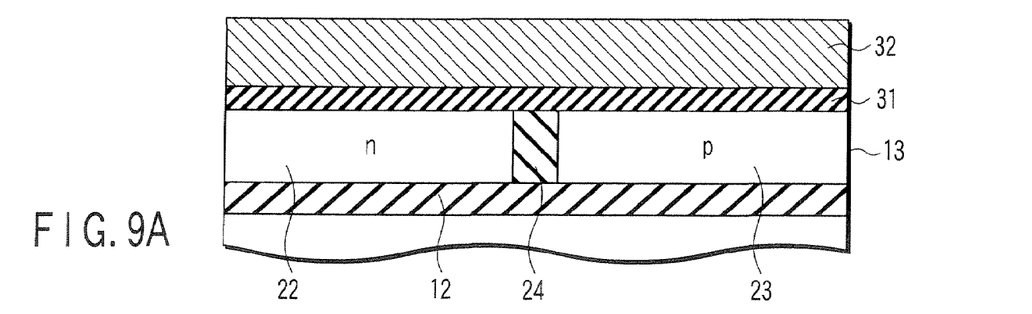
FIGS. 9A to 9I are sectional views showing step by step a manufacturing process of the semiconductor device according to the first embodiment.
Figure 9B:
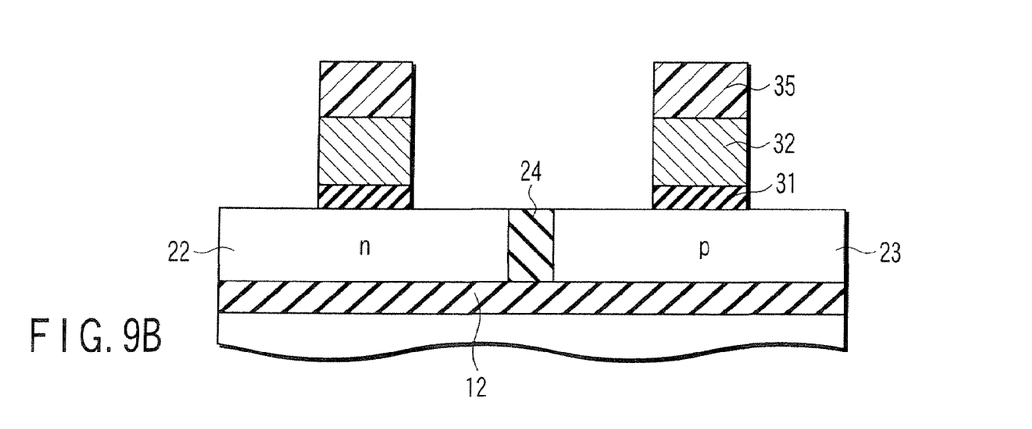

Next, a method of manufacturing the semiconductor device of the present embodiment will be described referring to FIGS. 9A to 9I. First, as shown in FIG. 9A, the SOI substrate 10 in which the Si layer 13 is formed on the Si substrate 11 via the buried dielectric film 12 is prepared, and the n-type well region 22 and the p-type well region 23 which are separated by the isolation dielectric film 24 are formed on the SOI layer (Si layer 13). Subsequently, the gate dielectric film 31 and the TaCx electrode 32 are deposited over the entire surface on a wafer.

A high dielectric (high-k) film as well as $SiO_2$ and $SiO_xN_y$ can be used as the gate dielectric film 31. The high-k film includes, for example, an oxide or mixed oxide of transition metals or rare-earth metals such as Ti, Hf, Zr and La, silicate-aluminate of transition metals or rare-earth metals such as Ti, Hf, Zr and La or a dielectric film in which nitrogen is added to the above materials, $Si_3N_4$, $Al_2O_3$, $Ta_2O_5$, $TiO_2$, $La_2O_3$, $CeO_2$, $ZrO_2$, $HfO_2$, $SrTiO_3$, $Pr_2O_3$ or a dielectric film in which nitrogen is added to the above materials. Here, SiON having a thickness of 1.5 nm is deposited by thermal oxidation and plasma nitriding by way of example. To form the high-k gate dielectric film, it is possible to use a metal organic chemical vapor deposition (MOCVD) method, an atomic layer deposition (ALD) method, a molecular beam epitaxy (MBE) method, a physical vapor deposition (PVD) method or the like.

The TaCx electrode 32 is formed by sputtering under Ar atmosphere using two targets including Ta and C. The film thickness is 100 nm. In the present embodiment, the flow of Ar is from 1 to 20 sccm, the ratio of electric power applied to the Ta target and the c target is from about 1:10 to 20, and the chamber pressure of the device during the deposition is from 0.01 to 0.3 Pa. The mole ratio of C to Ta (C/Ta) at this moment can be changed within 2 to 4. Here, the TaCx electrode 32 can also be formed by Ar sputtering using a TaCx compound target whose (C/Ta) is from 2 to 4. Further, the Ta target alone may be used, and reactive sputtering of an Ar/CH-based gas may be used. Still further, a CVD method, the MBE method, the ALD method or the like can be used instead of the sputtering method.

The mole ratio of C to Ta (C/Ta) in the TaCx electrode 32 of the present embodiment is limited to a range from 2 to 4 in accordance with the above-mentioned demands. After this step, if a treatment is carried out to oxidize the surface of the TaCx electrode 32 at an extremely small thickness, the process resisting property of the TaCx electrode in the following steps will then be improved. Here, spike annealing at 1000° C. is carried out under 1% oxygen atmosphere to form an oxide layer having a thickness of 1 nm or less on the TaCx surface.

Next, a resist pattern 35 for the gate electrode is formed in the structure in FIG. 9A using a normal lithographic technique and etching technique. Using this resist pattern 35 as a mask, the TaCx electrode 32 and the gate dielectric film 31 are etched by an ordinarily used etching gas, thus obtaining the structure in FIG. 9B.

Figure 9C:
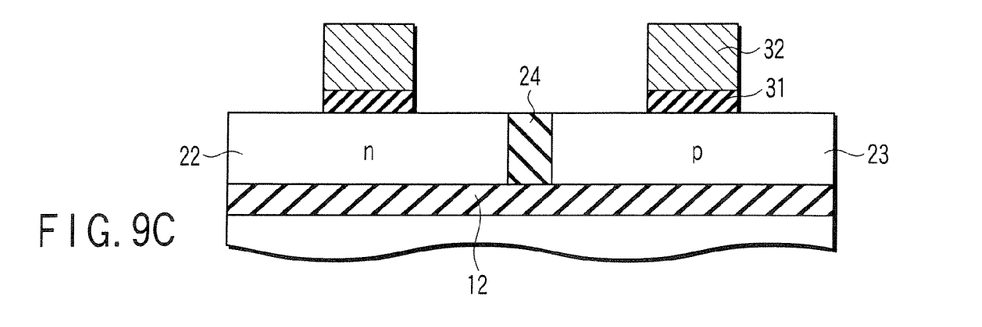

Next, as shown in FIG. 9C, the resist pattern 35 is removed by $O_2$ ashing. At this point, the side surfaces of the TaCx electrode 32 are slightly oxidized. Subsequently, the resist, residuals and the like which have not been completely removed by the $O_2$ ashing are chemically removed by a mixture of sulfuric acid and hydrogen peroxide. At this point, the TaCx electrode 32 essentially has a strong chemical resistance property, but in addition to this, has its surface covered with a thin oxide, so that it is not easily eroded by the mixture of sulfuric acid and hydrogen peroxide.

Figure 9D:
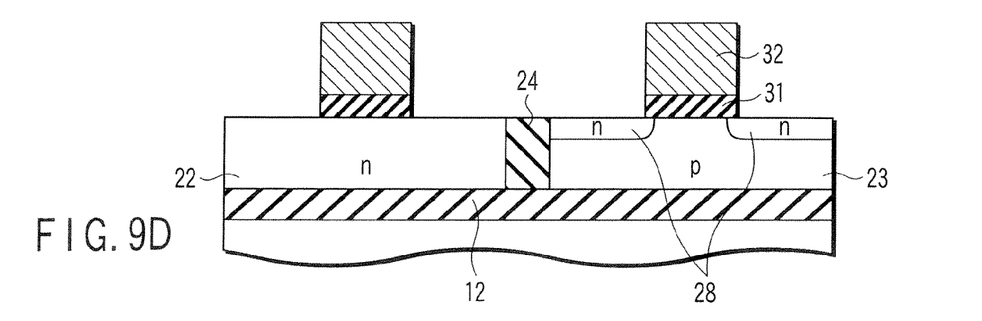

Next, as shown in FIG. 9D, the top of the n-type well region 22 is protected by a resist (not shown), and n-type impurities such as phosphorus, arsenic and antimony are ion-implanted into the p-type well region 23. Further, the resist on the n-type well region 22 is removed, and then the n-type extension layer 28 is formed by the spike annealing at 1000° C. or more.

Figure 9E:
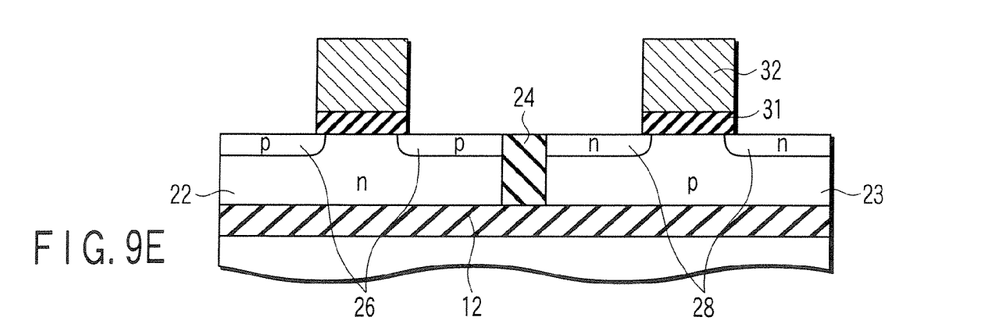

Next, as shown in FIG. 9E, the top of the p-type well region 23 is protected by a resist (not shown), and p-type impurities such as boron and indium are ion-implanted into the n-type well region 22. The resist on the p-type well region 23 is removed, and then the p-type extension layer 26 is formed by the spike annealing at 1000° C. or more.

Figure 9F:
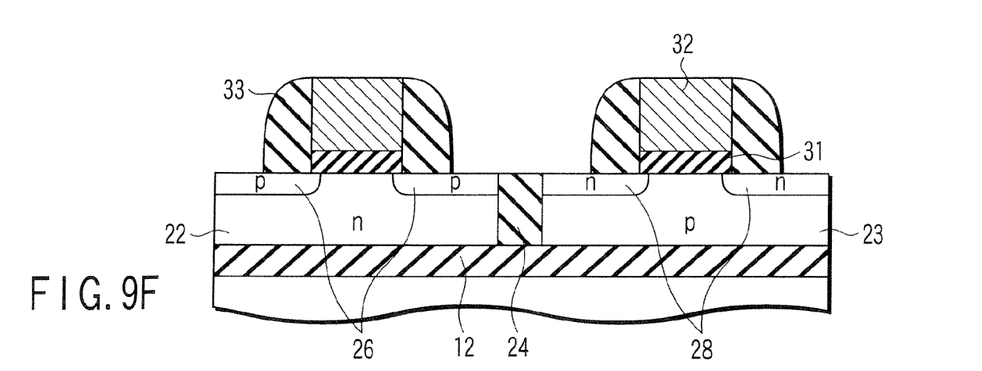

Next, as shown in FIG. 9F, the gate sidewall dielectric film 33 is formed in a normal process. That is, an oxide film is deposited over the entire surface on the substrate by the chemical vapor deposition (CVD) method or the like, and then etched back by reactive ion etching (RIE) or the like until the upper surface of the TaCx electrode 32 is exposed.

Figure 9G:
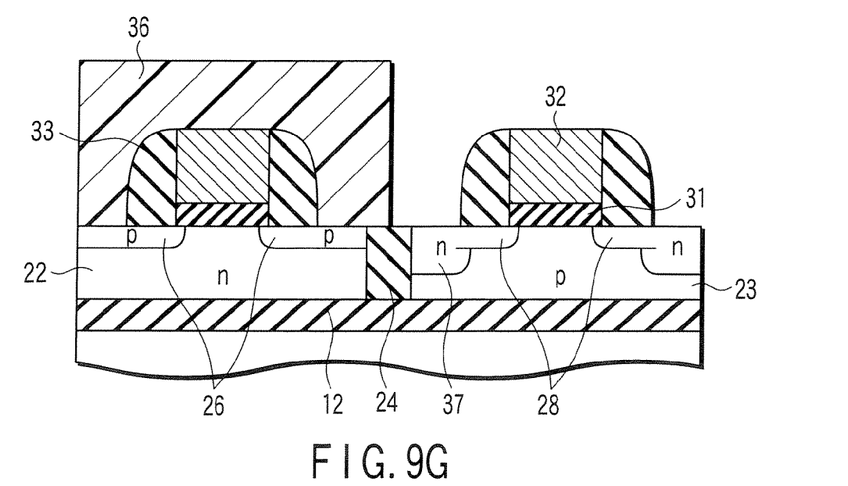

Next, as shown in FIG. 9G, the top of the n-type well region 22 is protected by a resist 36, and n-type impurities such as phosphorus, arsenic and antimony are ion-implanted into the p-type well region 23, thus forming an n-type implantation region 37.

Figure 9H:
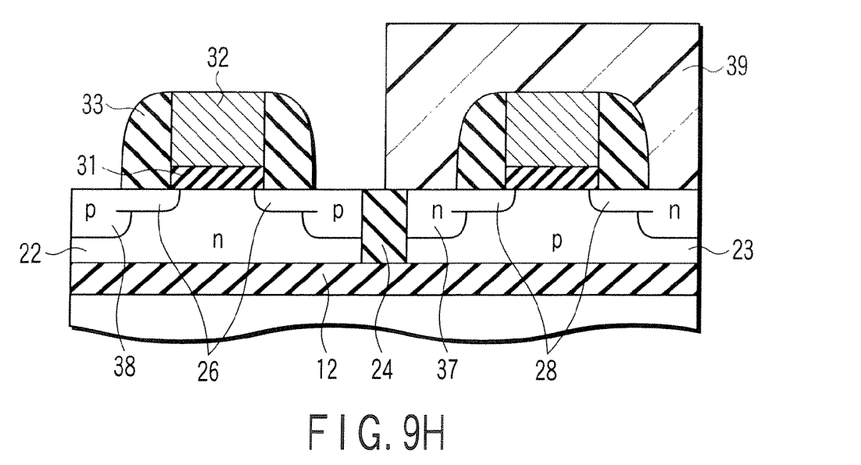

Next, as shown in FIG. 9H, the resist 36 on top of the n-type well region 22 is released, and then the top of the p-type well region 23 is protected by a resist 39, and p-type impurities such as boron and indium are ion-implanted into the n-type well region 22, thus forming a p-type implantation region 38.

Figure 9I:
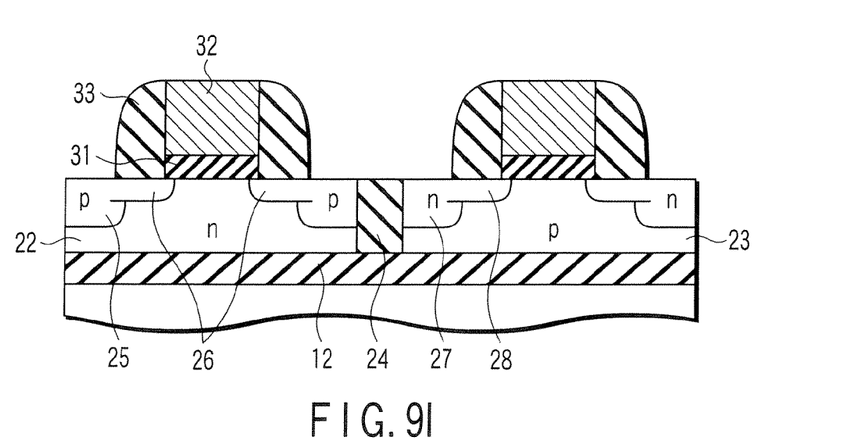

Next, as shown in FIG. 9I, the resist 39 on top of the p-type well region 23 is released, and a heat treatment at 900° C. or more is carried out to completely activate the n-type diffusion layer 27 and the p-type diffusion layer 25. Subsequently, after the formation of an interlayer dielectric film 34 and normal process steps such as planarization, the above-mentioned structure shown in FIG. 1 can be obtained.

Figure 10:
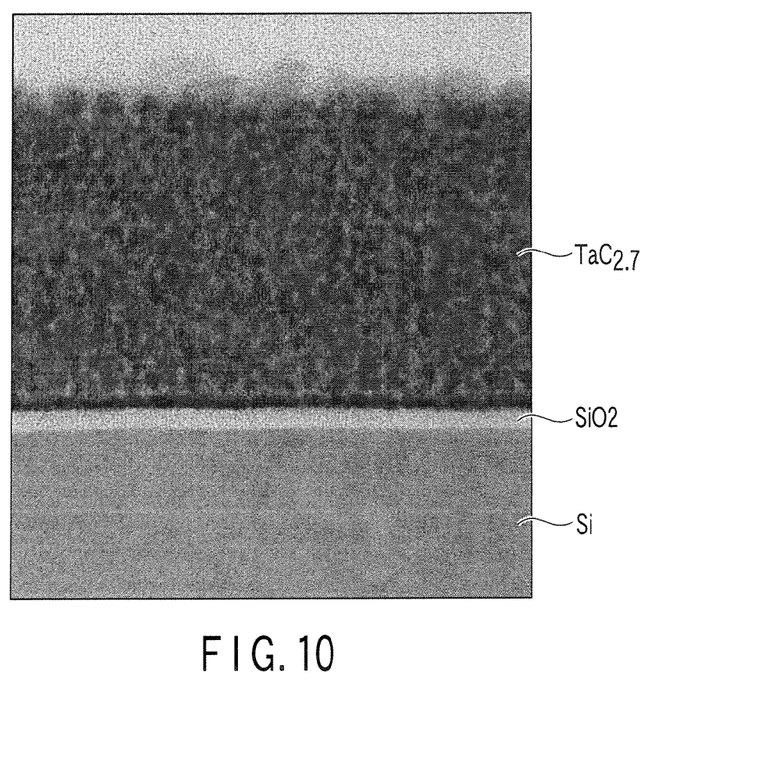
FIG. 10 is a photomicrograph showing a cross-sectional TEM image of the TaCx electrode at the completion of the device in the first embodiment.

FIG. 10 is a TEM photograph showing the section of the MIS structure composed of the TaCx electrode, the gate dielectric film and the Si at the completion of the device in the present embodiment. As shown in the drawing, no reaction has been caused between TaCx and $SiO_2$ even after the high-temperature heat treatment for the manufacture of the device, and the structure of the TaCx electrode is not at all changed from the state just after the deposition (FIG. 4).

The TaCx electrode 32 in the present embodiment has a work function corresponding to midgap energy of an Si bandgap, and therefore, in order to apply it to a normal planar bulk CMOS device, for example, counter-implantation of ions into a channel region is essential to achieve a lower threshold voltage, and it is difficult to obtain high current drivability. Therefore, for the present embodiment to be effectively utilized at the maximum, it is most desirably combined with a device which permits a low threshold voltage to be set, such as a silicon-on-insulator (SOI) device or a Fin-FET device in which the work function of the gate electrode corresponds to the midgap energy of silicon.

Furthermore, the gate dielectric film of the present embodiment can assume an amorphous structure. The TaCx electrode of the present embodiment has an amorphous structure or a phase-separated structure with a nanometer size, but when the gate dielectric film formed thereunder has a polycrystalline structure, its crystal grain boundary or the like could be the nucleus formation to partly crystallize the TaCx electrode, in which case the amorphous structure is advantageous. For example, when $HfO_2$ is used for the gate dielectric film, it is highly possible that phase-separated TaCx microcrystals easily cause nucleus generation at a place corresponding to a $HfO_2$ crystal grain boundary (this is called nonuniform nucleus generation), and the nuclei grow to a grain size of 5 nm or more in a subsequent LSI heat step. As has been already explained, the TaCx electrode of the present embodiment essentially has an amorphous structure or a phase-separated structure with a nanometer size, but its essential nature can be reversed at a peculiar place such as an interface with the gate dielectric film. Here, if an amorphous material is used for the gate dielectric film, there is no nucleus formation of TaCx crystals, so that the nonuniform nucleus generation as mentioned in the example of $HfO_2$ can not occur, and the essential amorphous structure or phase-separated structure with a nanometer size of TaCx of the present embodiment can be effectively utilized at the maximum.

A specific material for the gate dielectric film can be HfSiON by way of example. HfSiON is a material with the highest heat-resistive property under the existing circumstances which can maintain an amorphous state even after a heat treatment step at 1000° C. or more. HfAlO (the concentration of Hf is 22% or lower) and the like are also excellent amorphous materials, but $HfO_2$ crystals are partly produced therein after the heat treatment at 1000° C. or more, and there is an increased risk that these crystals function as the center of nucleus formation of the TaCx crystals previously described. In the present embodiment, because the heat step at 1000° C. or more is always carried out after the formation of the TaCx electrode, it is extremely important that HfSiON is used for the gate dielectric film. Naturally, the amorphous materials include $SiO_2$, SiON and the like, but the dielectric constant of these materials is low, and they do not have insulating properties sufficient for the gate dielectric films of future LSIs to which the present embodiment will be applied.

As described above, according to the present embodiment, it is possible to obtain a CMOS device having a low resistant and heat-resistive gate electrode free of problems such as depletion and threshold voltage variations. Moreover, it is possible to prevent an increase in the number of steps during the manufacture of this CMOS device, and a complicated process is no longer required.

Second Embodiment

Figure 11:
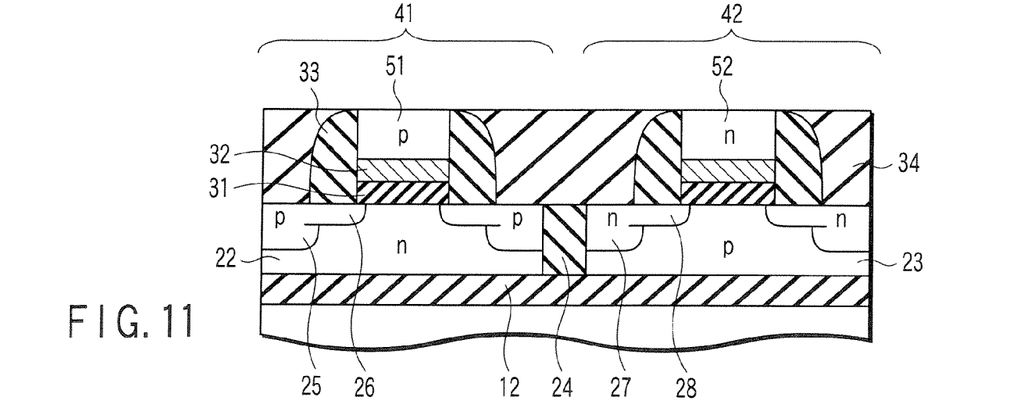
FIG. 11 is an element structure sectional view showing a schematic structure of a semiconductor device according to a second embodiment.

In a semiconductor device according to a second embodiment, as shown FIG. 11, the same reference numerals are assigned to the same parts as those in FIG. 1 and these parts are not described in detail.

A CMOS device of the present embodiment has a structure in which, on the top of a TaCx electrode 32, a $p^+$ silicon gate electrode 51 is disposed in a p-channel MIS transistor 41 and an $n^+$ silicon gate electrode 52 is disposed in an n-channel MIS transistor 42, in addition to the structure in the first embodiment.

That is, in the p-channel MIS transistor 41, the gate electrode has a double-layer structure composed of the TaCx lower electrode 32 and the $p^+$ upper silicon gate electrode 51. In the n-channel MIS transistor 42, the gate electrode has a double-layer structure composed of the TaCx lower electrode 32 and the $n^+$ silicon upper gate electrode 52.

Figure 12A:
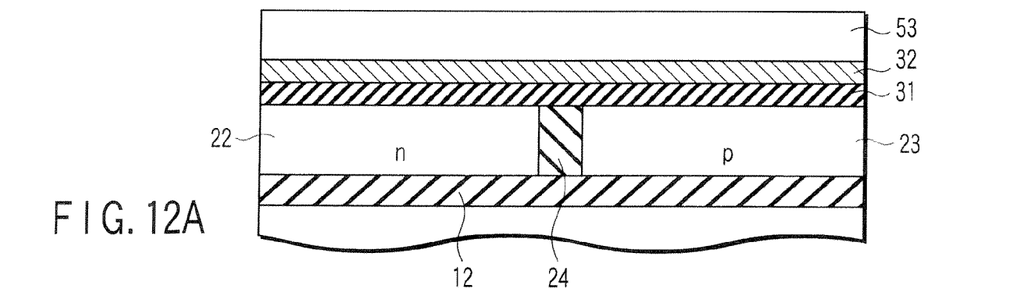
FIGS. 12A to 12D are sectional views showing step by step a manufacturing process of the semiconductor device according to the second embodiment.

Next, a method of manufacturing the semiconductor device of the present embodiment will be described referring to FIGS. 12A to 12D. First, as shown in FIG. 12A, an n-type well region 22 and a p-type well region 23 which are separated by an isolation dielectric film 24 are formed on an Si layer 13 of an SOI substrate 10. Subsequently, a gate dielectric material film 31 and the TaCx electrode 32 are deposited over the entire surface on a wafer, on which a non-doped silicon layer 53 is further deposited. Here, Ge may be added to the non-doped silicon layer 53 in a ratio of about 0.3 or less of Ge/Ge+Si.

For the gate dielectric film 31, it is possible to use, in addition to $SiO_2$ and SiOxNy, high-k gate dielectric films such as $HfO_2$, HfOxNy, HfSixOy, HfSixOyNz, HfAlxOy, HfAlxOyNz, LaHfxOy, $Al_2O_3$, $ZrO_2$, ZrSixOy and ZrSixOyNz. Here, HfSiON having a thickness of 3 nm (a ratio of 0.5 or less of Hf/Hf+Si, nitrogen concentration: 20 atomic percent) is deposited in accordance with an MOCVD method by way of example. Methods of deposition that can be used include an ALD method, an MBE method, a PVD method and the like.

The TaCx electrode 32 is formed by sputtering under an Ar atmosphere using two targets including Ta and C. The mole ratio of C to Ta (C/Ta) is 2.7, and the film thickness is 10 nm. Here, the TaCx electrode 32 may also be formed by a CVD method, the MBE method or the like instead of the sputtering method.

The mole ratio of C to Ta (C/Ta) in the TaC electrode 10 of the present embodiment is limited to a range from 2 to 4 in accordance with the above-mentioned demands. Moreover, its film thickness needs to be 5 nm or more for the reasons described later. The non-doped silicon layer 53 is deposited by the normal CVD method or the like, and its film thickness is 100 nm.

Next, a resist pattern 35 for the gate electrode is formed in the structure in FIG. 12A using a normal lithographic technique and etching technique. Using this resist pattern 35 as a mask, the non-doped silicon layer 53, the TaCx electrode 32 and the gate dielectric film 31 are etched by an ordinarily used etching gas, thus obtaining the structure in FIG. 12B.

Figure 12B:
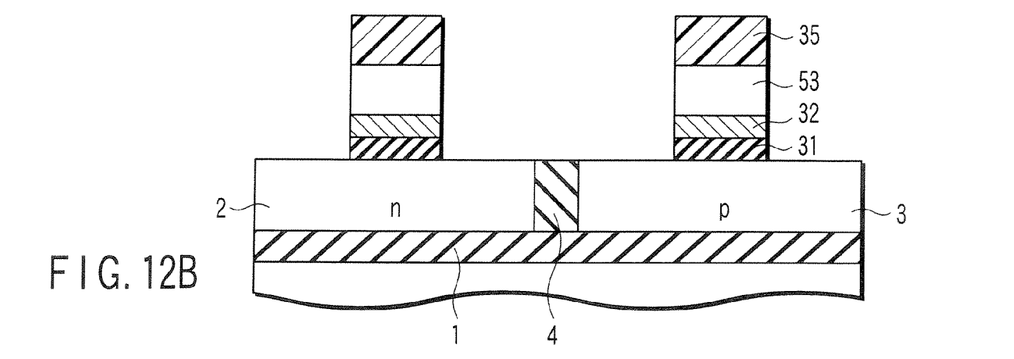

Then, the resist pattern 35 is removed by $O_2$ ashing. At this point, the side surfaces of the TaCx electrode 32 are slightly oxidized. Subsequently, the resist, residuals and the like which have not been completely removed by the $O_2$ ashing are chemically removed by a mixture of sulfuric acid and hydrogen peroxide.

In the present embodiment, in contrast with the first embodiment, most of the top of the TaCx electrode 32 is covered with the non-doped silicon layer 53, and end faces thereof are only slightly exposed. The slightly exposed surface of the TaCx electrode 32 is covered with a thin oxide. Thus, the gate laminated structure of the present embodiment is more difficult to be eroded by the mixture of sulfuric acid and hydrogen peroxide than in the first embodiment, and has a greater margin of process conditions. For example, the structural resistance properties of the present embodiment are effective when a long-time treatment is carried out to more thoroughly remove the residuals.

Figure 12C:
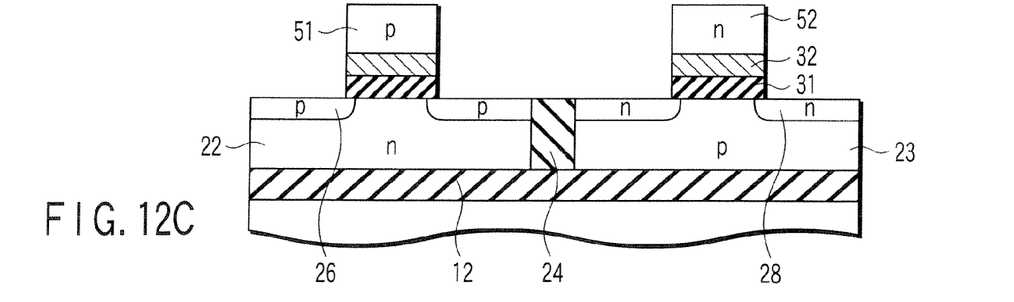

Subsequently, an n-type extension layer 28 and a p-type extension layer 26 are formed in a process similar to that in the first embodiment, thus obtaining the structure in FIG. 12C. It is to be noted that during this process, the non-doped silicon layer 53 serves as the $p^+$ silicon gate electrode 51 in the p-channel MIS transistor 41 and as the $n^+$ silicon gate electrode 52 in the n-channel MIS transistor 42.

Figure 12D:
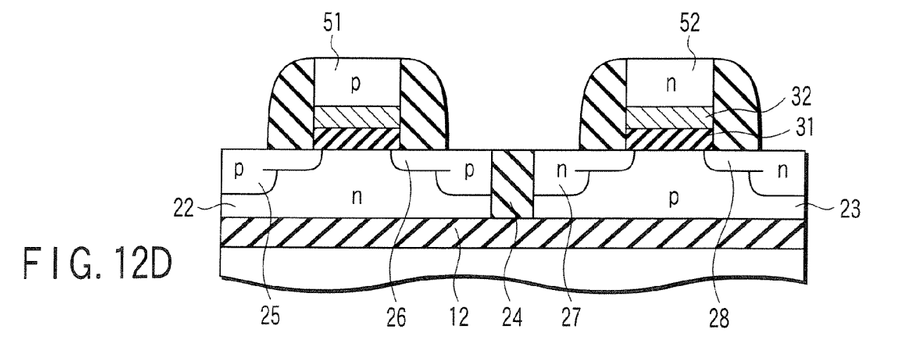

Furthermore, an n-type diffusion layer 27 and a p-type diffusion layer 25 are formed in a process step similar to that in the first embodiment, thus obtaining the structure in FIG. 12D. Subsequently, after the formation of an interlayer dielectric film 34 and normal process steps such as planarization, the above-mentioned structure in FIG. 11 is completed.

The advantage of the present embodiment is that effects of restraining device characteristic variations similar to those in the first embodiment can be achieved with a significantly high process resisting property by covering the TaCx layer with the silicon gate. It is contemplated that such an improvement in the process resisting property owing to the stacking of the silicon gate is similarly made in conventional midgap materials such as TiN and TaN.

However, these conventional stacks of the metal gate and the silicon gate have adverse effects in which impurities such as boron, arsenic and phosphorus added to the silicon gate diffuse and accumulate in, for example, TiN or TaN so that the work function is modulated or an impurity concentration in the silicon gate itself decreases to result in an increase of resistance.

Conversely, in the structure of the present embodiment, because the TaCx electrode 32 in the lower part is amorphous, it is difficult for the impurities of the silicon gate to infiltrate therein. This completely solves the problems such as the modulation of the work function in conventional TiN and TaN and the resistance increase in the silicon gate.

Here, the thickness of the TaCx electrode 32 in the present embodiment needs to be larger than 5 nm. The reason is that the above-mentioned effects of restraining the impurity infiltration are not easily exerted if the thickness of the TaCx electrode 32 is smaller. Moreover, the film thickness of TaCx is desirably 10 nm or less. The reason is that if TaCx is 10 nm or more, the region of TaCx exposed to the end face after the gate etching is increased, which makes it difficult to be able to obtain the effects of improving the process resisting property owing to the fact that the top is covered with silicon.

Third Embodiment

Figure 13:
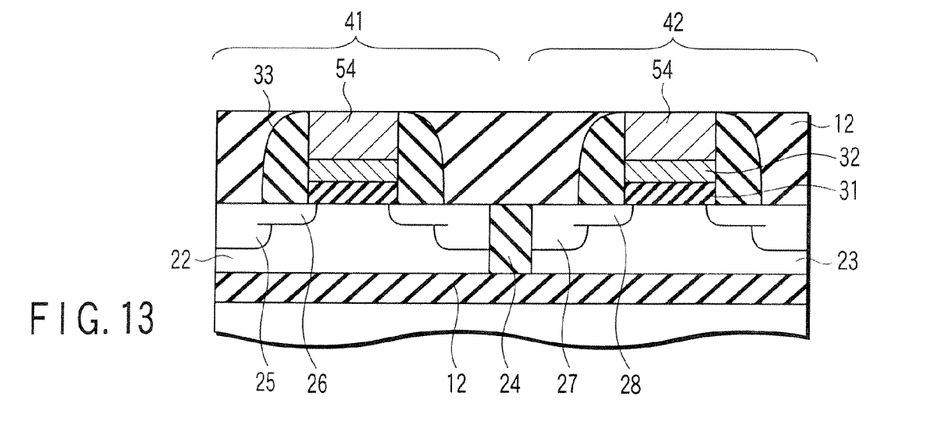
FIG. 13 is an element structure sectional view showing a schematic structure of a semiconductor device according to a third embodiment.

In a semiconductor device of a third embodiment, as shown in FIG. 13, the same reference numerals are assigned to the same parts as those in FIG. 1 and these parts are not described in detail.

A CMOS device in the present embodiment has a structure in which a silicide electrode 54 is disposed together with a p- and an n-channel MIS transistors on the top of a TaCx electrode 32, in addition to the structure in the first embodiment.

Figure 14A:
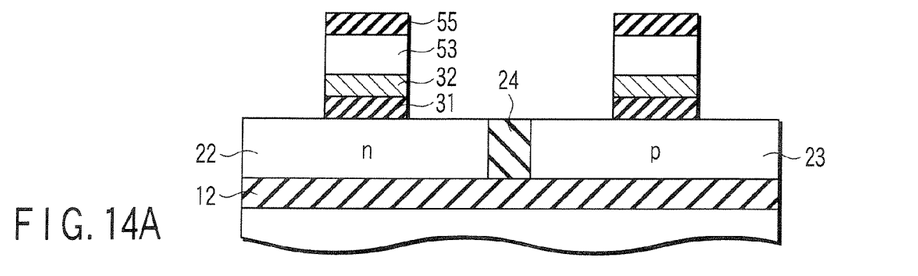
FIGS. 14A to 14F are sectional views showing step by step a manufacturing process of the semiconductor device according to the third embodiment.

Next, a method of manufacturing the semiconductor device of the present embodiment will be described referring to FIGS. 14A to 14F. First, as shown in FIG. 14A, an n-type well region 22 and a p-type well region 23 which are separated by an isolation dielectric film 24 are formed on an Si layer 13 of an SOI substrate 10. Subsequently, a gate dielectric material film 31 and the TaCx electrode 32 are deposited over the entire surface on a wafer, on which a non-doped silicon layer 53 is further deposited. Here, Ge may be added to the non-doped silicon layer 53 in a ratio of about 0.3 or less of Ge/Ge+Si. Moreover, a hard mask SiN layer 55 is deposited thereon.

For the gate dielectric film 31, it is possible to use, in addition to $SiO_2$ and SiOxNy, high-k gate dielectric films such as $HfO_2$, HfOxNy, HfSixy, HfSixOyNz, HfAlxOy, HfAlxOyNz, LaHfxOy, $Al_2O_3$, $ZrO_2$, ZrSixOy and ZrSixOyNz. Here, HfSiON having a thickness of 3 nm (a ratio of 0.5 or less of Hf/Hf+Si, nitrogen concentration: 20 atomic percent) is deposited by an MOCVD method by way of example. Methods of deposition that can be used include an ALD method, an MBE method, a PVD method and the like.

The TaCx electrode 32 is formed by sputtering under Ar atmosphere using two targets including Ta and C. The mole ratio of C to Ta (C/Ta) is 2.7, and the film thickness is 10 nm. Here, the TaCx electrode 32 may also be formed by a CVD method, the MBE method or the like instead of the sputtering method. The mole ratio of C to Ta (C/Ta) in the TaCx electrode 10 of the present embodiment is limited to a range from 2 to 4 in accordance with the above-mentioned demands. Moreover, its film thickness needs to be 5 nm or more for the reasons described later.

The non-doped silicon layer 53 is deposited by the normal CVD method or the like, and its film thickness is 100 nm. The hard mask SiN layer 55 can be formed by the normal CVD method, and its film thickness is 20 nm.

Subsequently, a resist pattern (not shown) for the gate electrode is formed in the structure described above using a normal lithographic technique and etching technique. Using it as a mask, the hard mask SiN layer 55, the non-doped silicon layer 53, the TaCx electrode 32 and the gate dielectric film 31 are etched by an ordinarily used etching gas, thus obtaining the structure in FIG. 14A.

Figure 14B:
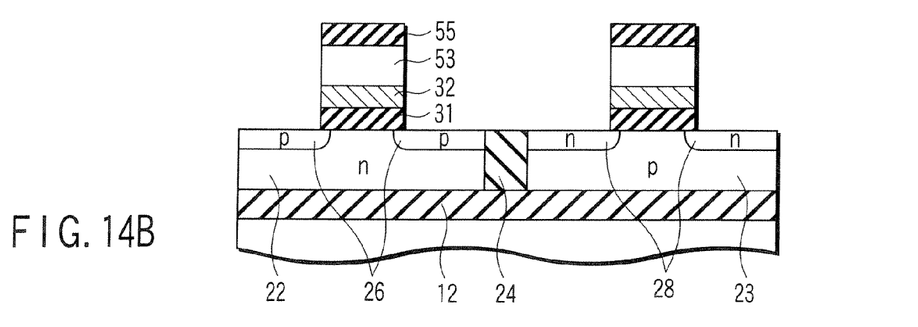

Then, an n-type extension layer 28 and a p-type extension layer 26 are formed in the structure in FIG. 14A, thus obtaining the structure in FIG. 14B. At this point, since the top of the non-doped silicon layer 53 is covered with the hard mask SiN layer 55, resistance is not reduced by impurities.

Figure 14C:
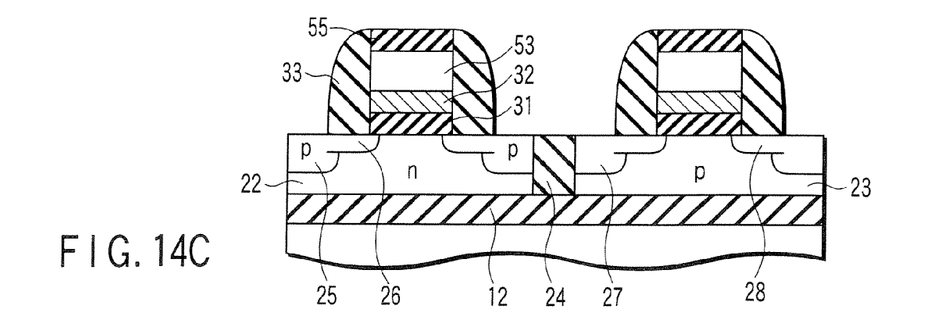

Subsequently, as shown in FIG. 14C, a gate sidewall dielectric film 33 is formed by, for example, SiN, and an n-type diffusion layer 27 and a p-type diffusion layer 25 are then formed. At this point, since the top of the non-doped silicon layer 53 is covered with the hard mask SiN layer 55, resistance is not reduced by impurities, as in the formation of the extension layers.

Figure 14D:
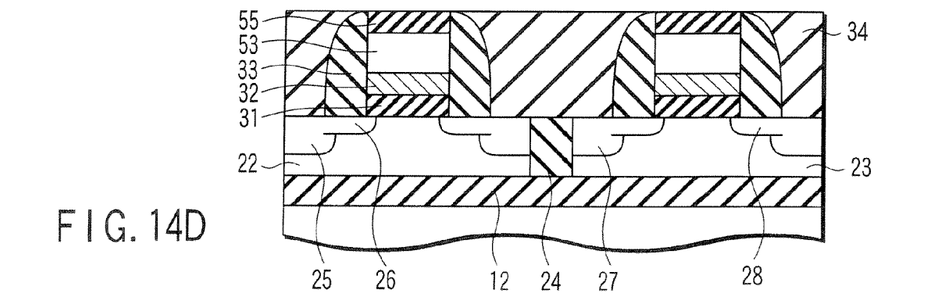
Figure 14E:
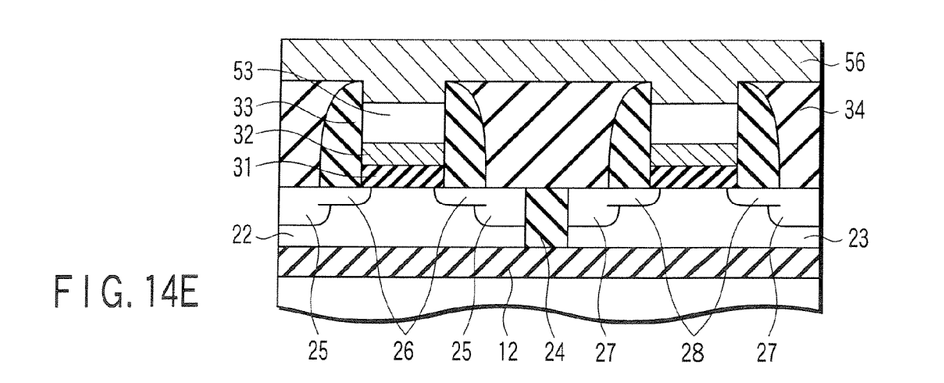

Next, an interlayer dielectric film 34 is deposited in the structure in FIG. 14C, and the surface of the element is planarized in a normal process step, thereby realizing the structure in FIG. 14D. Then, the hard mask SiN layer 55 is removed by a treatment with a solution such as a hot phosphoric acid. Further, a native oxide formed on the surface of the non-doped silicon layer 53 is removed by a treatment with a diluted HF solution, and then a metal layer 56, Ni in the present embodiment, is immediately deposited at 60 nm over the entire surface on the wafer by, for example, the sputtering method, thus obtaining the structure in FIG. 14E. In addition to Ni, it is also possible to use Co, Ti, Pt, Er, etc.

Figure 14F:
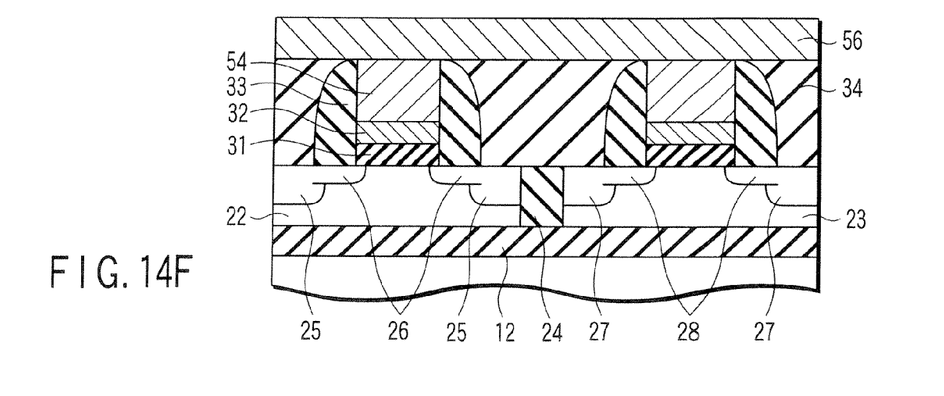

Next, as shown in FIG. 14F, a heat treatment is carried out to cause a solid-phase reaction between the metal layer 56 and the non-doped silicon layer 53, thereby forming the metal silicide 54. In the present embodiment, the heat treatment is carried out under a nitrogen atmosphere at 400° C. for 60 seconds to form an NiSi (monosilicide) phase. The heat treatment can be carried out at a temperature ranging from 350 to 550° C., and the time for conducting the heat treatment can be suitably changed.

Even when the non-doped silicon layer 53 contains germanium, the solid-phase reaction between the metal layer 56 and the non-doped silicon layer 53 can be accomplished in a similar process. In this case, metal germano-silicide, NiSiGe in the present embodiment, is formed instead of the metal silicide.

Subsequently, the unreacted metal layer 56 is selectively released from the metal silicide 54. In the present embodiment, Ni is selectively released from NiSi by a mixed solution of sulfuric acid and hydrogen peroxide. Thus, the structure in FIG. 13 is completed.

The present embodiment further improves the second embodiment which has improved the TaC electrode to overcome the vulnerability in the process resisting property in the first embodiment. In the second embodiment, the silicon gate electrode and the TaCx electrode constitute the laminated structure. Thus, it is impossible to avoid a sheet resistance of the gate electrode which is higher in principle than that in the first embodiment. Conversely, in the present embodiment, all the silicon gate electrodes in the second embodiment are converted to the metal silicide, thereby making it possible to reduce the sheet resistance of the gate electrode to a level substantially similar to that in the first embodiment.

In the present embodiment, the silicon electrodes of the n- and p-channel MIS transistors are converted to the metal silicide in a simultaneous process. Here, it is known that if the silicon electrodes are doped with impurities as in the second embodiment, the speed of the metal silicide formation greatly varies depending on the kind of the impurities. In this case, since the metal silicidation of the n- and p-channel MIS transistors proceeds ununiformly, it is highly possible that characteristic variations are caused between the transistors. Therefore, in the present embodiment, it is essential to carry out such a process that the silicon electrodes are not doped with impurities. In the present embodiment, this process is constituted by covering the top of the non-doped silicon layer 53 with the hard mask SiN layer 55.

In the present embodiment, the thickness of the TaCx electrode 32 needs to be larger than 5 nm. The reason is that if the thickness is 5 nm or less, the work function of the gate electrode in the present embodiment is determined by the work function of the metal silicide 54 in the upper layer rather than by the TaCx electrode 32. Here, for example, in the case of a silicide such as NiSi, it shows the work function corresponding to the midgap energy of an Si bandgap similar to that of the TaCx gate electrode, so that even if the TaCx electrode 32 has a thickness of 5 nm or less, a proper value can be achieved for the threshold voltage of the transistor. However, since the metal silicide assumes a polycrystalline structure, it is not possible to obtain the effects of reducing threshold voltage variations due to the amorphous structure or the phase-separated structure with a nanometer size which are the original intention of the present invention. Moreover, the thickness of the TaCx electrode 32 in the present embodiment is desirably 10 nm or less in accordance with the demands similar to those in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate;
   an n-type semiconductor region formed on the substrate;
   a p-type semiconductor region formed on the substrate so as to be insulated and separated from the n type semiconductor region;
   a p-channel metal insulator semiconductor (MIS) transistor formed on the n-type semiconductor region, the p-channel MIS transistor comprising:
   a first gate dielectric film formed on the n-type semiconductor region;
   a first lower gate electrode made of an alloy of Ta and C and formed on the first gate dielectric film; and
   a first upper gate electrode including silicon and formed on the first lower gate electrode; and
   an n-channel MIS transistor formed on the p type semiconductor region, the n-channel MIS transistor comprising:
   a second gate dielectric film formed on the p type semiconductor region;
   a second lower gate electrode made of an alloy of Ta and C and formed on the second gate dielectric film; and
   a second upper gate electrode including silicon and formed on the second lower gate electrode, and
   a mole ratio of C to Ta (C/Ta) in the first lower gate electrode and the second lower gate electrode being from 2 to 4, and
   the alloy of Ta and C in each of the first lower gate electrode and the second lower gate electrodes being amorphous.

2. The semiconductor device according to claim 1, wherein the film thickness of each of the first lower gate electrode and the second lower gate electrode is larger than 5 nm and smaller than 10 nm.

3. The semiconductor device according to claim 1, wherein the first upper gate electrode includes p+-type silicon or silicon germanium, and the second upper gate electrode includes n+-type silicon or silicon germanium.

4. The semiconductor device according to claim 1, wherein each of the first upper gate electrode and the second upper gate electrode include a metal suicide.

5. The semiconductor device according to claim 4, wherein the metal of the metal silicide is one selected from the group consisting of Ni, Co, Ti, Pt and Er.

6. The semiconductor device according to claim 1, wherein the first upper gate electrode and the second upper gate electrode are formed of an NiSi phase.

7. The semiconductor device according to claim 1, wherein the first dielectric film and the second dielectric film are made of a common material including HfSiON.

8. The semiconductor device according to claim 1, wherein a work function of the first and the second Ta—C gate electrode is from 4.5 to 4.7 eV.

9. The semiconductor device according to claim 1, wherein the p- and n-type semiconductor regions are insulated and separated by an isolation dielectric wall and a buried dielectric film disposed at the bottom of the p- and n-type semiconductor regions, wherein the isolation dielectric wall is connected to the buried dielectric film.

10. A semiconductor device comprising:
    a substrate;
    an n-type semiconductor region formed on the substrate;
    a p-type semiconductor region formed on the substrate so as to be insulated and separated from the n-type semiconductor region;
    a p-channel metal insulator semiconductor (MIS) transistor formed on the n-type semiconductor region, the p-channel MIS transistor comprising:
    a first gate dielectric film formed on the n-type semiconductor region;
    a first lower gate electrode made of an alloy of Ta and C and formed on the gate dielectric film; and
    a first upper gate electrode including silicon and formed on the first lower gate electrode; and
    an n-channel MIS transistor formed on the p-type semiconductor region, the n-channel MIS transistor comprising:
    a second gate dielectric film formed on the p-type semiconductor region;
    a second lower gate electrode made of an alloy of Ta and C and formed on the gate dielectric film; and
    a second upper gate electrode including silicon and formed on the second lower gate electrode,
    wherein a mole ratio of C to Ta (C/Ta) in the first lower gate electrode and the second lower gate electrode is 2 to 4, and
    the alloy of Ta and C in each of the first lower gate electrode and the second lower gate electrode has TaC precipitates formed in a C-rich TaC matrix.

11. The semiconductor device according to claim 10, wherein the film thickness of each of the first lower gate electrode and the second lower gate electrode is larger than 5 nm and smaller than 10 nm.

12. The semiconductor device according to claim 10, wherein the first upper gate electrode includes p+-type silicon or silicon germanium, and the second upper gate electrode includes n+-type silicon or silicon germanium.

13. The semiconductor device according to claim 10, wherein the alloy of Ta and C in each of the first lower gate electrode and the second lower gate electrodes being amorphous.

14. The semiconductor device according to claim 10, wherein a work function of the first and the second Ta—C gate electrode is from 4.5 to 4.7 eV.

15. The semiconductor device according to claim 10, wherein the p- and n-type semiconductor regions are insulated and separated by an isolation dielectric wall and a buried dielectric film disposed at the bottom of the p- and n-type semiconductor regions, wherein the isolation dielectric wall is connected to the buried dielectric film.

* * * * *